(12) United States Patent (10) Patent No.: US 12,701,875 B2
Choi et al. (45) Date of Patent: Aug. 4, 2026

(54) THIN FILM TRANSISTOR ARRAY SUBSTRATE WITH OVERLAPPING LIGHT SHIELDING LAYERS

(71) Applicant: LG Display Co., Ltd., Seoul (KR)

(72) Inventors: Howon Choi, Gyeonggi-do (KR); SeJune Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 561 days.

(21) Appl. No.: 17/993,669

(22) Filed: Nov. 23, 2022

(65) Prior Publication Data

US 2023/0217736 A1 Jul. 6, 2023

(30) Foreign Application Priority Data

Dec. 30, 2021 (KR) ........................ 10-2021-0193045

(51) Int. Cl.
*H10K 59/126* (2023.01)
*H10K 59/131* (2023.01)

(52) U.S. Cl.
CPC ......... *H10K 59/126* (2023.02); *H10K 59/131* (2023.02)

(58) Field of Classification Search
CPC ........................... H10K 59/126; H10K 59/131
See application file for complete search history.

(56) References Cited

U.S. PATENT DOCUMENTS

| | | | | |
|---|---|---|---|---|
| 2015/0206929 A1* | 7/2015 | Sato | ..................... | H10K 59/123 |
| | | | | 257/40 |
| 2020/0312890 A1* | 10/2020 | Oikawa | .............. | H10D 30/6723 |

FOREIGN PATENT DOCUMENTS

| | | |
|---|---|---|
| KR | 10-2004-0038729 A | 5/2004 |
| KR | 10-2018-0046229 A | 5/2018 |
| KR | 10-2019-0061823 A | 6/2019 |
| KR | 10-2020-0125843 A | 11/2020 |

* cited by examiner

*Primary Examiner* — Lex H Malsawma
(74) *Attorney, Agent, or Firm* — Birch, Stewart, Kolasch & Birch, LLP

(57) ABSTRACT

A thin film transistor array substrate can include a substrate having a plurality of subpixel areas in which a gate line, a data line and a power line are formed to cross one another, a first shielding layer provided on the substrate in any one of the plurality of subpixel areas, a first buffer layer provided on the first shielding layer, a second shielding layer provided on the first buffer layer to overlap the first shielding layer, a second buffer layer provided on the second shielding layer, and a thin film transistor provided in an area overlapped with the first shielding layer and the second shielding layer on the second buffer layer.

15 Claims, 3 Drawing Sheets

A - A'

B - B'

C - C 240  230  VL 500
240
230
220
210
100

C - C

230  VL 500
240
230
220
210
100

THIN FILM TRANSISTOR ARRAY SUBSTRATE WITH OVERLAPPING LIGHT SHIELDING LAYERS

CROSS-REFERENCE TO RELATED APPLICATIONS

This application claims priority to Korean Patent Application No. 10-2021-0193045 filed on Dec. 30, 2021 in the Republic of Korea, the entire contents of which are hereby expressly incorporated by reference into the present application.

BACKGROUND

Field of the Invention

The present disclosure relates to a thin film transistor array substrate.

Discussion of the Related Art

With the advancement of the information age, a demand for a display apparatus for displaying an image has increased in various forms. Therefore, various types of display apparatuses such as a liquid crystal display (LCD) apparatus, a plasma display panel (PDP) apparatus, and an electroluminescence display (ELD) apparatus have been recently used. The electroluminescence display (ELD) apparatus can include an organic light emitting display (OLED) apparatus and a quantum-dot light emitting display (QLED) apparatus.

Among the display apparatuses, the electroluminescence display apparatus is a self-light emitting type and has advantages in that a viewing angle and a contrast ratio better than those of the liquid crystal display (LCD) apparatus. Further, since the electroluminescence display apparatus does not require a separate backlight, it is advantageous that the electroluminescence display apparatus is able to be thin and lightweight and has low power consumption. Further, the electroluminescence display apparatus has advantages in that it can be driven at a direct current low voltage, has a fast response speed, and especially has a low manufacturing cost.

Meanwhile, in the structure of the related art, a shielding layer can be formed below a thin film transistor, so that light incident on the thin film transistor can be absorbed to avoid a leakage current. In this case, the shielding layer can be formed of a metal material and used as an additional gate electrode, so that a double gate structure can be used. Therefore, an operation current can be increased as compared with a thin film transistor having a single gate electrode.

At this time, a contact defect between the shielding layer used as a gate electrode and a data line can be avoided, and an insulating layer for covering the shielding layer and the data line can be provided to form a flat substrate. However, a limitation can exist in that crosstalks can occur due to parasitic capacitance occurring in the insulating layer provided between the shielding layer and the data line.

SUMMARY OF THE DISCLOSURE

The present disclosure has been formed in view of the above and other limitations associated with the related art, and it is an object of the present disclosure to provide a thin film transistor array substrate comprising a plurality of shielding layers electrically connected to a thin film transistor to improve characteristics of the thin film transistor and prevent crosstalks from occurring.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor array substrate comprising a substrate having a plurality of subpixel areas in which a gate line, a data line and a power line are formed to cross one another, a first shielding layer provided on the substrate in any one of the plurality of subpixel areas, a first buffer layer provided on the first shielding layer, a second shielding layer provided on the first buffer layer to overlap the first shielding layer, a second buffer layer provided on the second shielding layer, and a thin film transistor provided in an area overlapped with the first shielding layer and the second shielding layer on the second buffer layer.

In accordance with an aspect of the present disclosure, the above and other objects can be accomplished by the provision of a thin film transistor array substrate comprising a substrate, a thin film transistor including a gate electrode, a source electrode and a drain electrode, a first shielding layer provided on the substrate and electrically connected to the source electrode, a first buffer layer provided on the first shielding layer, and a second shielding layer provided on the first buffer layer and electrically connected to the gate electrode.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
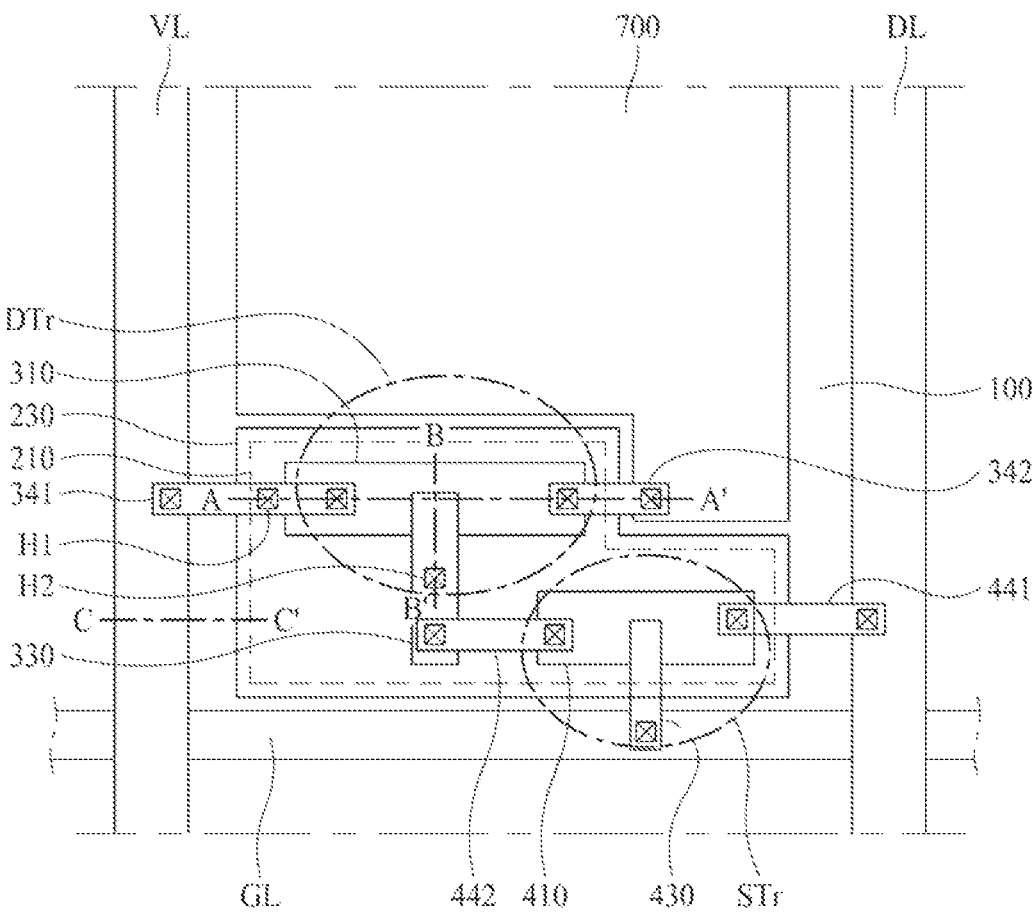
FIG. 1 is a plan view illustrating one subpixel of a thin film transistor array substrate according to one embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description can be omitted or can be provided briefly. In a case where 'comprise', 'have' and 'include' described in the present disclosure are used, another portion can be added unless 'only~' is used. The terms of a singular form can include plural forms unless referred to the contrary.

In construing an element, the element is construed as including an error range although there is no explicit description.

In describing a position relationship, for example, when the position relationship is described as 'on', 'upon', 'above', 'below' and 'next to', one or more portions can be arranged between two other portions unless 'just' or 'direct' is used.

In describing a temporal relationship, for example, when the temporal order is described as 'after', 'subsequent', 'next' and 'before', a case which is not continuous can be included unless 'just' or 'direct' is used.

It will be understood that, although the terms "first," "second," etc. can be used herein to describe various elements, these elements should not be limited by these terms. These terms are only used to distinguish one element from another and may not define any order or sequence. For example, a first element could be termed a second element, and, similarly, a second element could be termed a first element, without departing from the scope of the present disclosure.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in co-dependent relationship.

Hereinafter, various embodiments of the present disclosure will be described with reference to the drawings. All the components of each thin film transistor array substrate and each display device including the same according to all embodiments of the present disclosure are operatively coupled and configured.

FIG. 1 is a plan view illustrating one subpixel of a thin film transistor array substrate according to one embodiment of the present disclosure.

Referring to FIG. 1, the thin film transistor array substrate according to one embodiment of the present disclosure can include a substrate 100, a power line VL, a gate line GL, a data line DL, a driving thin film transistor DTr, a switching thin film transistor STr, a first shielding layer 210, a second shielding layer 230 and a pixel electrode 700.

The substrate 100 can be made of glass or plastic, but is not limited thereto. The substrate 100 can be made of a semiconductor material such as a silicon wafer.

A plurality of subpixel areas defined by a gate line GL arranged in one direction, a data line DL arranged to be perpendicular to the gate line GL and a power line VL arranged to be parallel with the data line DL are provided on the substrate 100. FIG. 1 illustrates a portion of one subpixel area.

The first shielding layer 210 can be provided on the substrate 100, and can be formed in an area surrounded by the gate line GL, the data line DL and the power line VL. Since the first shielding layer 210 is not connected to a signal line such as the gate line GL, the data line DL and the power line VL, the first shielding layer 210 may not perform a function of supplying a voltage to other elements.

In order to prevent semiconductor layers 310 and 410 of the driving thin film transistor DTr and the switching thin film transistor STr from being affected by external light, the first shielding layer 210 can be formed in an area overlapped with the semiconductor layers 310 and 410 of the driving thin film transistor DTr and the switching thin film transistor STr. In addition, an area of the first shielding layer 210 can be larger than that of each of the semiconductor layers 310 and 410.

The first shielding layer 210 can include a conductive material capable of shielding light. For example, the first shielding layer 210 can be made of an opaque metal material such as aluminum (Al), silver (Ag), copper (Cu), molybdenum (Mo), titanium (Ti), tungsten (W) or chromium (Cr), or their alloy. Further, although the first shielding layer 210 is shown as a single layer, the first shielding layer 210 can be formed of a multi-layer. For example, the first shielding layer 210 can be formed of a double layer, and the double layer can be comprised of a lower layer and an upper layer, which include their respective materials different from each other. In this case, the lower layer can be made of a molybdenum-titanium alloy (MoTi) and the upper layer can be made of copper (Cu), but the present disclosure is not limited thereto.

The second shielding layer 230 can be provided on the first shielding layer 210, and can be formed in an area surrounded by the gate line GL, the data line DL and the power line VL. Since the second shielding layer 230 is not connected to the signal line such as the gate line GL, the data line DL and the power line VL, the second shielding layer 230 may not perform a function of supplying a voltage to other elements.

Figure 2:
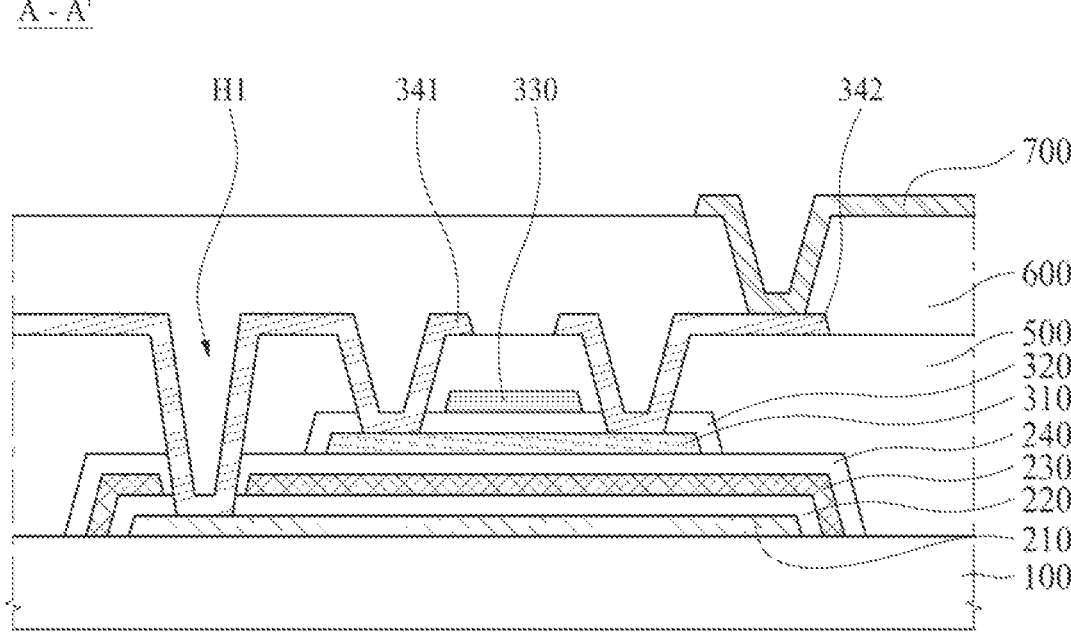
FIG. 2 is a cross-sectional view taken along line A-A' of FIG. 1, illustrating a thin film transistor array substrate according to one embodiment of the present disclosure.

The second shielding layer 230 can be formed in an area overlapped with the semiconductor layers 310 and 410 of the driving thin film transistor DTr and the switching thin film transistor STr. In addition, an area of the second shielding layer 230 can be larger than that of the first shielding layer 210. Therefore, as shown in FIG. 1, the second shielding layer 230 can be formed to surround outer sides of the first shielding layer 210. Referring to FIG. 2, the second shielding layer 230 can cover both sides of the first shielding layer 210.

In order to more effectively shield external light together with the first shielding layer 210, the second shielding layer 230 can include a conductive material capable of shielding light. For example, the second shielding layer 230 can be made of a metal material such as aluminum (Al), silver (Ag), copper (Cu), molybdenum (Mo), titanium (Ti), tungsten (W) or chromium (Cr), or their alloy. Further, although the second shielding layer 230 is shown as a single layer, the second shielding layer 230 can be formed of a multi-layer. For example, the second shielding layer 230 can be formed of a double layer, and the double layer can be comprised of a lower layer and an upper layer, which include their respective materials different from each other. Therefore, the second shielding layer 230 can more effectively shield the semiconductor layers 310 and 410 of the driving thin film transistor DTr and the switching thin film transistor STr from being affected by external light.

In addition, the second shielding layer 230 can be made of the same material as that of the first shielding layer 210, but is not limited thereto. The second shielding layer 230 can be made of a material different from that of the first shielding layer 210. For example, the second shielding layer 230 can include a transparent conductive material such as indium tin oxide (ITO). Alternatively, the second shielding layer 230 can include an opaque metal material different from that of the first shielding layer 210. When the second shielding layer 230 includes a transparent conductive material, since the second shielding layer 230 is electrically connected to a gate electrode 330 of the driving thin film transistor DTr, the driving thin film transistor DTr of the present disclosure can disclose a dual gate electrode structure. In addition, the second shielding layer 230 can serve to shield a parasitic capacitor generated between the power line VL and the first shielding layer 210 because the second shielding layer 230 is formed to surround the power line VL. When the second shielding layer 230 includes an opaque metal material, the second shielding layer 230 can serve to shield light in addition to the above function.

The switching thin film transistor STr is disposed in an area where the gate line GL and the data line DL cross each other, and is provided on the second shielding layer 230. The switching thin film transistor STr can serve as a switching element for applying a signal to the subpixel.

The switching thin film transistor STr can include a semiconductor layer 410, a gate electrode 430, a source electrode 441 and a drain electrode 442. The switching thin film transistor STr can be connected to the gate line GL and the data line DL. For example, the gate electrode 430 of the switching thin film transistor STr can be connected to the gate line GL, and the source electrode 441 of the switching thin film transistor STr can be connected to the data line DL.

One side of the semiconductor layer 410 of the switching thin film transistor STr can be connected to the source electrode 441 of the switching thin film transistor STr through a contact hole, and the other side of the semiconductor layer 410 can be connected to the drain electrode 442 of the switching thin film transistor STr through the contact hole.

The switching thin film transistor STr can be turned on or off by a scan signal supplied through the gate line GL. Therefore, when a data voltage is supplied through the data line DL, the switching thin film transistor STr can control that the data voltage is applied to the subpixel through the scan signal.

The driving thin film transistor DTr is provided on the second shielding layer 230, and serves to drive the subpixel based on the signal applied by the switching thin film transistor. Referring to FIG. 1, the gate electrode 330 of the driving thin film transistor DTr can be connected to the drain electrode 442 of the switching thin film transistor STr through a contact hole. In addition, a source electrode 341 of the driving thin film transistor DTr can be connected to the power line VL, and a drain electrode 342 of the driving thin film transistor DTr can be connected to the pixel electrode 700 through the contact hole.

One side of the semiconductor layer 310 of the driving thin film transistor DTr can be connected to the source electrode 341 of the driving thin film transistor DTr through the contact hole, and the other side of the semiconductor layer 310 of the driving thin film transistor DTr can be connected to the drain electrode 342 of the driving thin film transistor DTr through the contact hole.

FIG. 2 is a cross-sectional view taken along line A-A' of FIG. 1, illustrating a thin film transistor array substrate according to one embodiment, more specifically illustrating a cross-section of a driving thin film transistor DTr.

Referring to FIG. 2, the thin film transistor array substrate according to one embodiment of the present disclosure can include a substrate 100, a first shielding layer 210, a first buffer layer 220, a second shielding layer 230, a second buffer layer 240, a driving thin film transistor DTr, and a pixel electrode 700.

The substrate 100 can be made of glass or plastic, but is not limited thereto. The substrate 100 can be made of a semiconductor material such as a silicon wafer.

The first shielding layer 210 can be provided on the substrate 100, and can be made of a conductive material capable of shielding light. For example, the first shielding layer 210 can be made of a metal material such as aluminum (Al), silver (Ag), copper (Cu), molybdenum (Mo), titanium (Ti), tungsten (W) or chromium (Cr), or their alloy. Further, although the first shielding layer 210 is shown as a single layer, the first shielding layer 210 can be formed of a multi-layer. For example, the first shielding layer 210 can be formed of a double layer, and the double layer can be comprised of a lower layer and an upper layer, which include their respective materials different from each other. In this case, the lower layer can be made of a molybdenum-titanium alloy (MoTi) and the upper layer can be made of copper (Cu), but the present disclosure is not limited thereto.

The first buffer layer 220 is provided on the first shielding layer 210. The first buffer layer 220 can be formed of a single layer of silicon nitride (SiNx) or silicon oxide (SiOx), or a multi-layer of silicon nitride (SiNx) and silicon oxide (SiOx). The first buffer layer 220 can insulate the first shielding layer 210, and can improve adhesion between layers formed thereon and the substrate 100.

The second shielding layer 230 can be provided on the first buffer layer 220, and can include a conductive material capable of shielding light. For example, the second shielding layer 230 can be made of an opaque metal material such as aluminum (Al), silver (Ag), copper (Cu), molybdenum (Mo), titanium (Ti), tungsten (W) or chromium (Cr), or their alloy. Alternatively, the second shielding layer 230 can be made of a transparent metal material. For example, the second shielding layer 230 can be made of indium tin oxide (ITO).

The second buffer layer 240 is provided on the second shielding layer 230. The second buffer layer 240 can be formed of a single layer of silicon nitride (SiNx) or silicon oxide (SiOx), or a multi-layer of silicon nitride (SiNx) and silicon oxide (SiOx). The second buffer layer 240 can be made of the same material as that of the first buffer layer 220. The second buffer layer 240 can insulate the second shielding layer 230, and can improve adhesion between layers formed thereon and the substrate 100.

The driving thin film transistor DTr can be provided on the second buffer layer 240, and can be disposed at a position overlapped with the first shielding layer 210 and the second shielding layer 230. The driving thin film transistor DTr can include a semiconductor layer 310, a gate insulating layer 320, a gate electrode 330, a source electrode 341 and a drain electrode 342.

The semiconductor layer 310 of the driving thin film transistor DTr is provided on the second buffer layer 240. The semiconductor layer 310 can include a poly-silicon semiconductor or an oxide semiconductor. When the semiconductor layer 310 includes an oxide semiconductor, the semiconductor layer 310 can include at least one of indiumgallium-zinc-oxide (IGZO), indium-zinc-oxide (IZO), indium-gallium-tin-oxide (IGTO) or indium-gallium-oxide (IGO).

The gate insulating layer 320 of the driving thin film transistor DTr can be provided on the semiconductor layer 310 to insulate the gate electrode 330 from the semiconductor layer 310. The gate insulating layer 320 of the driving thin film transistor DTr can be formed of a single layer of silicon nitride (SiNx) or silicon oxide (SiOx), or a multi-layer of silicon nitride (SiNx) and silicon oxide (SiOx).

The gate electrode 330 of the driving thin film transistor DTr is provided on the gate insulating layer 320. The gate electrode 330 can be formed on the gate insulating layer 320 to overlap a channel area of the semiconductor layer 310.

An interlayer insulating layer 500 is provided on the gate insulating layer 320 and the gate electrode 330 of the driving thin film transistor DTr. The interlayer insulating layer 500 can be formed of an organic insulating material such as an acrylic resin, an epoxy resin, a phenolic resin, a polyamide resin or a polyimide resin.

A contact hole for exposing the semiconductor layer 310 of the driving thin film transistor DTr can be formed in the gate insulating layer 320 and the interlayer insulating layer 500 of the driving thin film transistor DTr.

The source electrode 341 and the drain electrode 342 of the driving thin film transistor DTr are provided on the interlayer insulating layer 500 while facing each other. Further, each of the source electrode 341 and the drain electrode 342 of the driving thin film transistor DTr can be connected to the semiconductor layer 310 through a contact hole formed in the gate insulating layer 320 and the interlayer insulating layer 500.

A first contact hole H1 passing through the first buffer layer 220, the second shielding layer 230, the second buffer layer 240 and the interlayer insulating layer 500 can be formed to expose the first shielding layer 210. The source electrode 341 of the driving thin film transistor DTr can be extended in a direction in which the first contact hole H1 is formed, and can be electrically connected to the first shielding layer 210 through the first contact hole H1. A lower surface of the first contact hole H1 exposes the first shielding layer 210, and inner sides of the first contact hole H1 are comprised of sides of the first buffer layer 220, the second buffer layer 240 and the interlayer insulating layer 500. For example, the second buffer layer 240 can be formed to cover sides of the second shielding layer 230 positioned in an area adjacent to the first contact hole H1 to insulate the second shielding layer 230 from the source electrode 341 of the driving thin film transistor DTr.

Therefore, the first shielding layer 210 can be formed below the driving thin film transistor DTr, so that the first shielding layer 210 can prevent external light from affecting the semiconductor layer 310 of the driving thin film transistor DTr, whereby reliability of the driving thin film transistor DTr can be improved. In addition, the first shielding layer 210 can be connected with the source electrode 341 of the driving thin film transistor DTr, so that the first shielding layer 210, which is made of the conductive material, can be electrically stabilized, whereby the first shielding layer 210 can be prevented from disturbing a normal operation of the semiconductor layer 310 of the driving thin film transistor DTr.

A planarization layer 600 is provided on the interlayer insulating layer 500. The planarization layer 600 can compensate for a step difference due to the driving thin film transistor DTr and the contact holes. The planarization layer 600 can be made of an inorganic insulating material or an organic insulating material. Alternatively, the planarization layer 600 can be formed as a layer made of an organic insulating material and a layer made of an inorganic insulating material are stacked.

The pixel electrode 700 can be provided on the planarization layer 600, and can be connected to the drain electrode 342 through a contact hole formed in the planarization layer 600.

Figure 3:
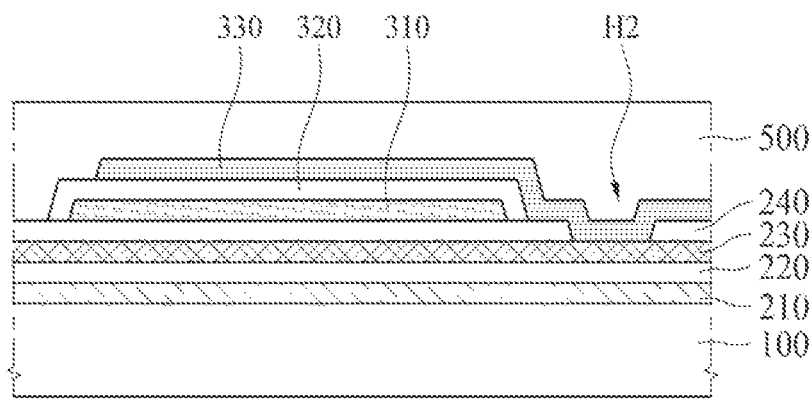
FIG. 3 is a cross-sectional view taken along line B-B' of FIG. 1, illustrating a thin film transistor array substrate according to one embodiment of the present disclosure.

FIG. 3 is a cross-sectional view taken along line B-B' of FIG. 1, illustrating a thin film transistor array substrate according to one embodiment, more specifically illustrating a cross-section of a driving thin film transistor DTr.

The thin film transistor array substrate according to FIG. 3 can include the same elements as the substrate 100, the first shielding layer 210, the first buffer layer 220, the second shielding layer 230 and the second buffer layer 240 of the thin film transistor array substrate according to FIGS. 1 and 2.

The driving thin film transistor DTr can be provided on the second buffer layer 240, and can be disposed at a position overlapped with the first shielding layer 210 and the second shielding layer 230. The semiconductor layer 310, the gate insulating layer 320 and the gate electrode 330 of the driving thin film transistor DTr are shown in FIG. 3, and the driving thin film transistor DTr of FIG. 3 can include the same elements as those of the driving thin film transistor DTr according to FIGS. 1 and 2.

A second contact hole H2 passing through the second buffer layer 240 can be formed to expose the second shielding layer 230. A lower surface of the second contact hole H2 exposes the second shielding layer 230, and inner sides of the second contact hole H2 can be comprised of sides of the second buffer layer 240. The gate electrode 330 of the driving thin film transistor DTr can be extended in a direction in which the second contact hole H2 is formed, and can be electrically connected to the second shielding layer 230 through the second contact hole H2.

When the second shielding layer 230 includes a conductive material capable of shielding light, the second shielding layer 230 is formed below the driving thin film transistor DTr, whereby the second shielding layer 230 can more effectively prevent external light from affecting the semiconductor layer 310 of the driving thin film transistor DTr together with the first shielding layer 210. Therefore, reliability of the driving thin film transistor DTr can be further improved. In addition, the second shielding layer 230 can be connected with the gate electrode 330 of the driving thin film transistor DTr, so that the second shielding layer 230, which is made of the conductive material, can be electrically stabilized. As a result, the second shielding layer 230 can be prevented from disturbing a normal operation of the semiconductor layer 310.

Since the second shielding layer 230 is electrically connected to the gate electrode 330 of the driving thin film transistor DTr, the driving thin film transistor DTr of the present disclosure can disclose a dual gate electrode structure. In detail, the second shielding layer 230 disposed below the semiconductor layer 310 of the driving thin film transistor DTr can serve as a lower gate electrode, and the gate electrode 330 disposed above the semiconductor layer 310 of the driving thin film transistor DTr can serve as an upper gate electrode.

When the driving thin film transistor DTr has a dual gate electrode structure, all the upper and lower portions of the channel area of the semiconductor layer 310 of the driving thin film transistor DTr can be electrically controlled. Therefore, a leakage current flowing through the semiconductor layer 310 of the driving thin film transistor DTr can be minimized, so that current characteristics of the driving thin film transistor DTr can be improved, and reliability can be improved. Although the dual gate electrode structure is applied to the driving thin film transistor DTr in the present disclosure, the dual gate electrode structure can be equally applied to the switching thin film transistor STr.

Figure 4:
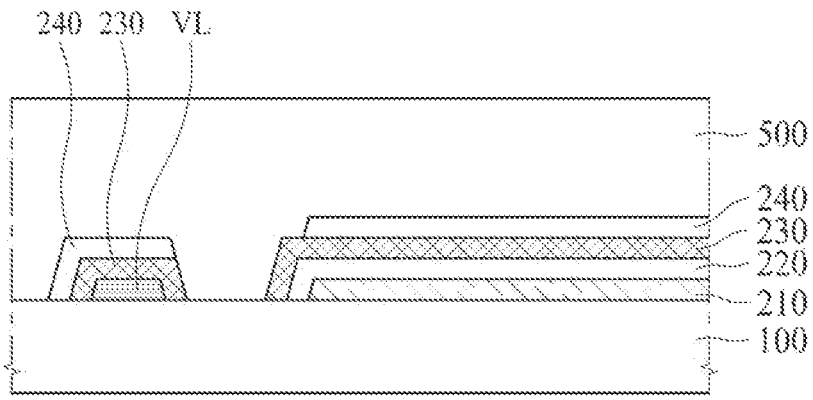
FIG. 4 is a cross-sectional view taken along line C-C' of FIG. 1, illustrating a thin film transistor array substrate according to one embodiment of the present disclosure.

FIG. 4 is a cross-sectional view taken along line C-C' of FIG. 1, illustrating a thin film transistor array substrate according to one embodiment, more specifically illustrating a pixel area, in which a thin film transistor is not provided, and a power line VL.

The thin film transistor array substrate according to FIG. 4 can include the same elements as the substrate 100, the first shielding layer 210, the first buffer layer 220, the second shielding layer 230 and the second buffer layer 240 of the thin film transistor array substrate according to FIGS. 1 and 2.

The first buffer layer 220 can be formed to cover an end of the first shielding layer 210, and the second shielding layer 230 can be formed to cover an end of the first buffer layer 220. The second buffer layer 240 can expose a portion of the second shielding layer 230, but is not limited thereto. The second buffer layer 240 can be formed to cover an end of the second shielding layer 230.

As described above with reference to FIGS. 2 and 3, each of the first shielding layer 210 and the second shielding layer 230 can be electrically connected to the source electrode 341 and the gate electrode 330 of the driving thin film transistor DTr. At this time, a storage capacitor Cst can be formed through the first buffer layer 220 provided between the first shielding layer 210 and the second shielding layer 230. For example, the first shielding layer 210 and the second shielding layer 230 serve as a lower electrode and an upper electrode of the storage capacitor Cst, respectively, and the first buffer layer 220 can serve as a dielectric layer of the storage capacitor Cst.

In a single gate electrode structure of the related art, an electrode is additionally provided above and below the gate insulating layer of the thin film transistor to form a storage capacitor. Since the capacitance of the storage capacitor is inversely proportional to a thickness of the dielectric and is proportional to an area of the dielectric, the thickness of the dielectric or can be reduced or the area of the dielectric can be increased to increase the capacitance of the storage capacitor. However, since there is a limitation in adjusting the thickness or area of the gate insulating layer, there can be a limitation in increasing the capacitance of the storage capacitor.

On the other hand, in the present disclosure, since a storage capacitor Cst is formed through the first shielding layer 210, the first buffer layer 220 and the second shielding layer 230, which are provided below the driving thin film transistor DTr, a size of each element of the storage capacitor Cst can be changed more easily than a structure of the related art. In detail, since the first shielding layer 210 and the second shielding layer 230 are formed below the driving thin film transistor DTr, areas of an upper electrode and a lower electrode of the storage capacitor Cst can be more increased than those of the related art. Further, as the areas of the upper electrode and the lower electrode of the storage capacitor Cst are increased, an area with which the first buffer layer 220 is in contact, can be also increased, whereby the area of the dielectric of the storage capacitor Cst can be also increased. Therefore, since the capacitance of the storage capacitor Cst can be more increased than that of the related art, the maintenance characteristics of a voltage applied to a pixel can be improved.

Figure 5:
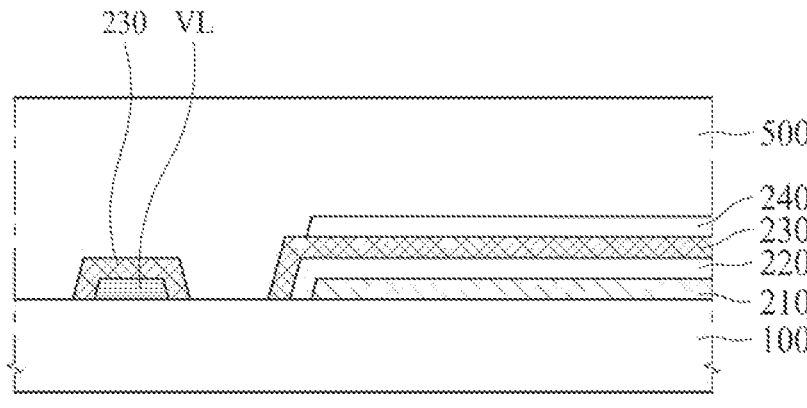
FIG. 5 is a cross-sectional view taken along line C-C' of FIG. 1, illustrating a thin film transistor array substrate according to another embodiment of the present disclosure.

The power line VL can be provided on the substrate 100, and can be formed on in same layer as the first shielding layer 210. The power line VL can be formed in the same process as that of the first shielding layer 210. The second shielding layer 230 can be formed on the power line VL. Referring to FIGS. 4 and 5, the second shielding layer 230 can cover both sides and an upper surface of the power line VL. Unlike the structure in which the power line VL is only formed, when the second shielding layer 230 is formed on the power line VL, a parasitic capacitor generated between the power line VL and the first shielding layer 210 can be more effectively reduced, whereby crosstalk can be further reduced.

Referring to FIGS. 4 and 5, an insulating material can be only disposed between a side of the second shielding layer 230 covering the power line VL and a side of the second shielding layer 230 covering the first shielding layer 210. For example, as shown in FIGS. 4 and 5, only an interlayer insulating layer 500 made of an organic material is positioned in an area where a side of the second shielding layer 230 covering the power line VL and a side of the second shielding layer 230 covering the first shielding layer 210 face each other.

A portion of the power line VL can be covered with the second buffer layer 240. For example, as shown in FIG. 4, the second buffer layer 240 can be extended from one of two sides of the power line VL, which does not face the first shielding layer 210, and can be formed to reach an upper surface of the second shielding layer 230. Alternatively, as shown in FIG. 5, the second buffer layer 240 may not be formed on the power line VL. A portion of the gate line GL and the data line DL can be covered with the second buffer layer 240, the second buffer layer 240 may not be formed on the gate line GL and the data line DL.

Meanwhile, in the dual gate electrode structure of the related art, one insulating layer covering both the signal line, such as the power line or the data line, and the lower gate electrode is formed. In this case, the insulating layer can be formed even in a space between the signal line and the lower gate electrode to form a parasitic capacitor Cp. For example, the signal line and the lower gate electrode can serve as the lower electrode and the upper electrode of the parasitic capacitor Cp, and the insulating layer can serve as a dielectric layer of the parasitic capacitor Cp. Since the total capacitance of the pixel excludes the capacitance of the parasitic capacitor Cp from the capacitance of the storage capacitor Cst, efficiency of the pixel can be reduced when the parasitic capacitor Cp is formed. Further, due to the parasitic capacitor Cp, a leakage current can flow between the signal line and the lower gate electrode, and crosstalk can occur together.

On the other hand, the first buffer layer 220 of the present disclosure is formed only on the area where the first shielding layer 210 is disposed, and the first buffer layer 220 is not formed in an area between the power line VL and the second shielding layer 230 serving as a gate electrode of the driving thin film transistor DTr. For example, the first buffer layer 220 can be disposed only in an area overlapped with the first shielding layer 210. Therefore, after an insulating material such as silicon nitride (SiNx) or silicon oxide (SiOx) is deposited to cover an entire surface of the substrate 100, the insulating material deposited between the power line VL and the second shielding layer 230 can be removed to form the second buffer layer 240. Therefore, since a material layer serving as a dielectric layer is not formed between the power line VL and the second shielding layer 230 serving as a gate electrode of the driving thin film transistor DTr, a parasitic capacitor may not be formed between the power line VL and the second shielding layer 230. Therefore, unlike the dual gate electrode structure of the related art, the capacitance of the storage capacitor Cst can be maximized, and a leakage current can be prevented from flowing between the power line VL and the second shielding layer 230 serving as a gate electrode of the driving thin film transistor DTr, whereby crosstalk can be prevented from occurring.

According to the present disclosure, the following advantageous effects can be obtained.

According to the present disclosure, as the first shielding layer and the second shielding layer, which are respectively used as the source electrode and the gate electrode, are formed, characteristics of the thin film transistor can be improved, and crosstalk between the signal line and the thin film transistor can be prevented from occurring.

It will be apparent to those skilled in the art that the present disclosure described above is not limited by the above-described embodiments and the accompanying drawings and that various substitutions, modifications and variations can be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor array substrate comprising:
a substrate having a plurality of subpixel areas in which a gate line, a data line and a power line cross one another;
a first shielding layer provided on the substrate in any one of the plurality of subpixel areas;
a first buffer layer provided on the first shielding layer;
a second shielding layer provided on the first buffer layer to overlap the first shielding layer;
a second buffer layer provided on the second shielding layer; and
a thin film transistor provided in an area overlapped with the first shielding layer and the second shielding layer on the second buffer layer,
wherein the power line is disposed on a same layer as the first shielding layer,
wherein the first buffer layer is not disposed between the power line and the second shielding layer,
wherein the power line is provided in a same layer as the first shielding layer, and
wherein the second shielding layer directly contacts and covers an upper and both side surfaces of the power line.

2. The thin film transistor array substrate of claim 1, wherein the first shielding layer and the second shielding layer are made of a conductive material capable of shielding light.

3. The thin film transistor array substrate of claim 1, wherein an area of the second shielding layer is larger than an area of the first shielding layer.

4. The thin film transistor array substrate of claim 1, wherein the first buffer layer covers an end of the first shielding layer adjacent to the gate line, the data line and the power line, and
the second shielding layer covers an end of the first buffer layer adjacent to the gate line, the data line and the power line.

5. The thin film transistor array substrate of claim 1, wherein the second buffer layer is provided on an upper surface of the second shielding layer, and
the second buffer layer is not provided on the gate line, the data line and the power line.

6. The thin film transistor array substrate of claim 1, wherein the thin film transistor includes:
a semiconductor layer provided on the second buffer layer;
a gate insulating layer provided on the semiconductor layer;
a gate electrode provided on the gate insulating layer;
a source electrode connected to one side of the semiconductor layer; and
a drain electrode connected to another side of the semiconductor layer.

7. The thin film transistor array substrate of claim 6, further comprising a first contact hole exposing the first shielding layer,
wherein the first shielding layer is electrically connected to the source electrode through the first contact hole.

8. The thin film transistor array substrate of claim 7, wherein the first contact hole passes through the first buffer layer, the second shielding layer, and the second buffer layer, and
inner sides of the first contact hole are composed of sides of the first buffer layer and sides of the second buffer layer.

9. The thin film transistor array substrate of claim 6, further comprising a second contact hole exposing the second shielding layer,
wherein the second shielding layer is electrically connected to the gate electrode through the second contact hole.

10. The thin film transistor array substrate of claim 9, wherein the second contact hole passes through the second buffer layer, and
inner sides of the second contact hole are composed of sides of the second buffer layer.

11. A thin film transistor array substrate comprising:
a substrate having a plurality of subpixel areas in which a gate line, a data line and a power line are formed to cross one another;
a thin film transistor including a gate electrode, a source electrode and a drain electrode;
a first shielding layer provided on the substrate and electrically connected to the source electrode;
a first buffer layer provided on the first shielding layer; and
a second shielding layer provided on the first buffer layer and electrically connected to the gate electrode,
wherein the power line is provided in a same layer as the first shielding layer, and
wherein the second shielding layer directly contacts and covers an upper surface and both side surfaces of the power line.

12. The thin film transistor array substrate of claim 11, wherein the thin film transistor array substrate further comprises a second buffer layer provided on the second shielding layer, and
the thin film transistor is provided in an area overlapped with the first shielding layer and the second shielding layer on the second buffer layer.

13. The thin film transistor array substrate of claim 12, wherein the thin film transistor array substrate further comprises a first contact hole that passes through the first buffer layer, the second shielding layer, and the second buffer layer, and the first shielding layer is electrically connected to the source electrode through the first contact hole.

14. The thin film transistor array substrate of claim 12, wherein the thin film transistor array substrate further comprises a second contact hole that passes through the second buffer layer, and the second shielding layer is electrically connected to the gate electrode through the second contact hole.

15. The thin film transistor array substrate of claim 11, wherein the first buffer layer is not disposed between the power line and the second shielding layer.

* * * * *